(12) United States Patent
Albano et al.

(10) Patent No.: US 12,720,908 B2
(45) **Date of Patent: *Aug. 25, 2026**

(54) SELF-SIMILAR HIGH EFFICIENCY SOLAR CELLS AND CONCENTRATORS

(71) Applicants: Nant Holdings IP, LLC, Culver City, CA (US); NantG Power, LLC, Culver City, CA (US)

(72) Inventors: Fabio Albano, Culver City, CA (US); John Chmiola, Culver City, CA (US); Patrick Soon-Shiong, Los Angeles, CA (US); Nicholas J. Witchey, Laguna Hills, CA (US)

(73) Assignees: NantG Power, LLC, El Segundo, CA (US); Nant Holdings IP, LLC, Culver City, CA (US)

( * ) Notice: Subject to any disclaimer, the term of this patent is extended or adjusted under 35 U.S.C. 154(b) by 116 days.

This patent is subject to a terminal disclaimer.

(21) Appl. No.: 18/740,330

(22) Filed: Jun. 11, 2024

(65) Prior Publication Data

US 2026/0047232 A1 Feb. 12, 2026

Related U.S. Application Data

(63) Continuation of application No. 18/076,302, filed on Dec. 6, 2022, now Pat. No. 12,040,419.

(51) Int. Cl.
*H10F 77/63* (2025.01)
*H02S 20/32* (2014.01)
(Continued)

(52) U.S. Cl.
CPC ............. *H10F 77/63* (2025.01); *H02S 20/32* (2014.12); *H10F 77/488* (2025.01); *H10F 19/00* (2025.01)

(58) Field of Classification Search
CPC ......... H10F 77/488; H10F 77/63; H02S 20/32
See application file for complete search history.

(56) References Cited

U.S. PATENT DOCUMENTS 4,173,213 A 11/1979 Kelly
4,200,472 A 4/1980 Chappell
(Continued)

FOREIGN PATENT DOCUMENTS

CN 1983642 A 6/2007
CN 102089598 A 6/2011
(Continued)

OTHER PUBLICATIONS

International Application No. PCT/US2023/082473, International Search Report and Written Opinion mailed on Apr. 3, 2024, 10 pages.

*Primary Examiner* — Golam Mowla
(74) *Attorney, Agent, or Firm* — Umberg Zipser LLP; Martin Fessenmaier; Priti Phukan

(57) ABSTRACT

Described are optical devices, such as photovoltaic modules that include features such as solar tracking, solar concentration, tandem cell arrangements, and thermal management to achieve high photovoltaic efficiency. The photovoltaic modules can be constructed using a variety of different materials and configurations or as a monoblock functionally graded structure to limit manufacturing, operational, and maintenance complexities while achieving high performance. The use of thermal management structures directly integrated into a photovoltaic cell can maintain such cells at desirable temperatures, which can be beneficial in optical concentrating configurations.

20 Claims, 6 Drawing Sheets

(51) Int. Cl.
*H10F 19/00* (2025.01)
*H10F 77/42* (2025.01)

(56) References Cited

U.S. PATENT DOCUMENTS

| | | | |
|---|---|---|---|
| 4,284,839 | A | 8/1981 | Johnson |
| 4,350,837 | A | 9/1982 | Clark |
| 7,709,730 | B2 | 5/2010 | Johnson |
| 8,184,372 | B1 | 5/2012 | Gu |
| 10,168,412 | B2 | 1/2019 | Plourde |
| 11,271,517 | B2 | 3/2022 | Martin |
| 2005/0081909 | A1 | 4/2005 | Paull |
| 2006/0126336 | A1 | 6/2006 | Solomon |
| 2007/0251569 | A1 | 11/2007 | Shan et al. |
| 2007/0267055 | A1* | 11/2007 | Gaudiana .............. H10K 30/30 136/244 |
| 2008/0135087 | A1 | 6/2008 | Anikara |
| 2008/0210292 | A1 | 9/2008 | Urli |
| 2009/0114265 | A1 | 5/2009 | Millbourne |
| 2010/0068839 | A1 | 3/2010 | Ray |
| 2010/0163014 | A1 | 7/2010 | Johnson |
| 2010/0212654 | A1 | 8/2010 | Alejo Trevijano |
| 2011/0174359 | A1 | 7/2011 | Goei |
| 2011/0277815 | A1 | 11/2011 | Sankrithi |
| 2011/0279918 | A1 | 11/2011 | Almogy |
| 2011/0284055 | A1 | 11/2011 | Almogy |
| 2012/0160234 | A1 | 6/2012 | Wares |
| 2012/0204863 | A1 | 8/2012 | Langhorst |
| 2012/0298181 | A1 | 11/2012 | Cashion et al. |
| 2013/0186451 | A1 | 7/2013 | Tanti |
| 2013/0263393 | A1* | 10/2013 | Mazumder .............. H02S 40/10 427/535 |
| 2013/0264041 | A1 | 10/2013 | Zhamu et al. |
| 2018/0019358 | A1 | 1/2018 | Ahn |
| 2022/0045644 | A1 | 2/2022 | Shtein et al. |

FOREIGN PATENT DOCUMENTS

| | | | |
|---|---|---|---|
| EP | 2290703 | A1 | 3/2011 |
| GB | 2481401 | A | 12/2011 |
| KR | 20110023317 | A | 3/2011 |
| MY | 141623 | A | 5/2010 |
| WO | 2004114419 | A1 | 12/2004 |
| WO | 2010032095 | A2 | 3/2010 |
| WO | 2012107605 | A1 | 8/2012 |

* cited by examiner

SELF-SIMILAR HIGH EFFICIENCY SOLAR CELLS AND CONCENTRATORS

CROSS-REFERENCE TO RELATED APPLICATION

This application is a continuation of U.S. patent application Ser. No. 18/076,302, filed on Dec. 6, 2022, the entire contents of which is incorporated herein by reference in their entirety for all purposes.

FIELD

This invention is in the field of high-efficiency solar-harvesting and concentrating devices, e.g., photovoltaic cells and solar concentrators. This invention relates generally high-efficiency photovoltaic modules including low-profile solar tracking and concentration and graphene-based thermal circuits for heat management.

BACKGROUND

Photovoltaics is a continually evolving field, where traditional single junction silicon-based devices, continue to capture large portions of the market. These traditional devices tend to have relatively low efficiencies compared to more advanced devices. Various types of materials and device configurations have been incorporated into commercially-available photovoltaic modules with efficiencies above 20% or even 25%. There is a continuing need for higher efficiency photovoltaics.

SUMMARY

Ultra-high-efficiency photovoltaic materials have been proposed, however they remain limited due to the high cost of semiconductor materials and the difficulty in manufacturing them. Concentrated photovoltaic (CPV) systems reduce semiconductor materials requirements but they present limitations in terms of acceptance angles and produce diminishing returns without precise tracking of the sun. Conventional trackers used to achieve the required tracking precision are large, heavy, complex, costly, and unsuitable for deployment in many desirable locations including residential rooftops. Thus, there is a need to address the limitations of narrow acceptance angle, tracking ability, and cost of such devices.

This disclosure provides self-similar 3D geometric structures formed via transformation of 2D planar semiconductor materials using Origami (folding) and Kirigami (cutting) techniques to enable a variety of geometric transformations. In addition to flat (2D materials), 3D semiconductor materials with functionally graded areas in any given Cartesian geometric dimension (X, Y, Z) or materials that have been formed through self-assembly, driven by Fokker-Plank time dependent potentials or materials formed through spinodal decomposition of two or more phases having variable compositions in 3D, for example, are useful 3D geometric structures. The disclosure provides an approach wherein a 2D pattern of cuts or fold lines transforms a planar photovoltaic material slab into a 3D, or as an alternative a 3D single slab material with functionally graded areas that self-assemble, providing one-piece compliant mechanism that allows for increased efficiency, optical tracking over solid angles in multiple axis of above 100° and up to 150°, maintaining optical efficiencies above 90% and presenting concentration abilities of above 80×.

In an aspect, devices are provided herein, such as photovoltaic modules, optical-tracking modules, energy-harvesting modules, or the like. An example device of this aspect comprises a substrate, such as a substrate comprising a solar tracking structure; an optical concentrator supported by the substrate; an optical cell positioned within the optical concentrator; and a thermal management structure in thermal contact with the optical cell to conduct heat from the optical cell. In some examples, the optical cell is a photovoltaic cell. In some examples, the optical cell is a reflector cell.

Various substrate structures and configurations are useful with the devices described herein. In some examples, the substrate includes structures configured to tilt the optical concentrator to a range of tilt angles to track solar radiation. For example, the substrate may include structures configured to tilt the optical concentrator to a range of solid angles in multiple directions above 100° and up to 150° out of plane of the substrate.

In some examples, the substrate comprises an origami or kirigami structure, such as including or configured to generate a three-dimensional structure produced from linear translation of a two-dimensional or planar structure. For example, the substrate may comprise or include plurality of cuts through the substrate that define a support structure that is configured to tilt the optical concentrator at a tilt angle based on application of a lateral force or displacement to the flexible substrate. Optionally, a magnitude of the tilt angle is based on one or more of locations of the plurality of cuts, sizes of the plurality of cuts, direction of the lateral force or displacement, or magnitude of the lateral force or displacement. Optionally, the substrate is planar, but may be deformed to take on a non-planar configuration by lateral displacement or stretching of the substrate.

In some examples, the substrate has an elastic modulus greater than or about 10 MPa, such as from about 10 MPa to about 100 MPa. Optionally, the substrate comprises a polymer, metal foils, composites, flexible ceramics, spring steel, or combinations thereof. Optionally, the substrate comprises a polymer having a glass transition temperature above 45° C. In some examples, the substrate comprises an optically transparent material. Specific useful materials for the substrate include those comprising graphene or including a graphene coating on at least a portion of the substrate. Optionally, the substrate comprises a flexible substrate. In some examples, the flexible substrate comprises a hinge, an elastic material, or a resilient member.

Various optical concentrator structures and configurations are useful with the devices described herein. For example, the optical concentrator may comprise a parabolic cup, a polygonal structure having parabolic sidewalls, or a lens structure. In some examples, useful lens structures include those comprising a planar lens or a Fresnel lens. Optionally, the optical concentrator comprises a non-imaging optical device arranged to focus incident radiation onto the optical cell. In some examples, the optical concentrator comprises a flexible base layer with a reflective coating thereon. The optical concentrator may be characterized by an optical concentration factor of from about 2× to about 500× or more, such as about 2×, about 5×, about 10×, about 50×, about 100×, about 150×, about 200×, about 250×, about 300×, about 350×, about 400×, about 450×, or about 500×. Without limitation, the optical concentrator may occupies a height from the flexible substrate of up to 50 mm.

Optionally, the optical concentrator is arranged on the flexible substrate to receive, focus, track, and/or direct incident solar radiation onto the optical cell. Optionally, the optical concentrator comprises an origami or kirigami structure. For example, the origami or kirigami structure comprises a three-dimensional structure produced from linear translation of a two-dimensional or planar structure.

In some examples, devices described herein may comprise a plurality of optical concentrators, such as distributed across and supported by the flexible substrate. Optionally, devices of this aspect may comprise a plurality of optical cells, such as each positioned within corresponding optical concentrators of the plurality of optical concentrators or at a focus position of the corresponding optical concentrators.

A variety of optical cells are useful with the devices described herein. In some examples, the optical cell comprises a photovoltaic cell. In some examples, the optical cell comprises a reflective cell. Optionally, the optical cell comprises a reflector or mirror arranged to reflect incident radiation, such as a reflective structure that reflects and focuses incident radiation onto another structure (e.g., a photovoltaic cell).

In some examples, the optical cell comprises a first electrode positioned over the flexible substrate; a second electrode positioned over the flexible substrate; and one or more photovoltaic junctions positioned between the first electrode and the second electrode.

Optionally, the photovoltaic junction comprises single crystal silicon, multicrystalline silicon, amorphous silicon, copper indium gallium selenide, gallium arsenide, cadmium telluride, a dye-sensitized material, a perovskite material, an organic photovoltaic material, or any combination of these. In some examples, the optical cell includes one or more electrodes comprising a graphene layer a micro- or nano-structured carbonaceous material layer. In some examples, the optical cell is a tandem photovoltaic cell. Optionally, the optical cell comprises a perovskite/Si tandem photovoltaic cell, a CdTe/Si tandem photovoltaic cell, a perovskite/copper indium gallium selenide tandem photovoltaic cell, or an organic tandem photovoltaic cell.

A variety of thermal management structures are useful with the devices described herein. In some examples, the thermal management structure is positioned on a radiation-receiving surface of one or more of the substrate, the optical concentrator, or the optical cell.

Optionally, the thermal management structure is positioned opposite a radiation-receiving surface of one or more of the substrate, the optical concentrator, or the optical cell. Optionally, the thermal management structure comprises one or more through vias for passing thermal energy or heat from a radiation-receiving surface of one or more of the substrate, the optical concentrator, or the optical cell to a surface opposite the radiation-receiving surface. Optionally, the thermal management structure dissipates heat from the optical cell through a heat-conducting thermal circuit. Optionally, the thermal management structure comprises or is coupled to one or more electrodes of the optical cell. In some examples, the thermal management structure comprises or is thermally coupled to a waste-heat-to-power converter.

In some examples, the thermal management structure comprises a material having a thermal conductivity greater than about 1 W/m·K and/or up to 5000 W/m·K, such as from 1 W/m·K to 5 W/m·K, from 5 W/m·K to 10 W/m·K, from 10 W/m·K to 50 W/m·K, from 50 W/m·K to 100 W/m·K, from 100 W/m·K to 500 W/m·K, from 500 W/m·K to 1000 W/m·K, or from 1000 W/m·K to 5000 W/m·K. Useful thermal management structures include those comprising a micro- or nano-structured carbonaceous material. Optionally, the thermal management structure comprises graphene, graphene oxide, carbon nanotubes, diamond, diamond-like carbon, exfoliated graphite, or carbon black. Optionally, the thermal management structure comprises a composite material including graphene, graphene oxide, carbon nanotubes, diamond, diamond-like carbon, exfoliated graphite, or carbon black.

Without wishing to be bound by any particular theory, there can be discussion herein of beliefs or understandings of underlying principles relating to the invention. It is recognized that regardless of the ultimate correctness of any mechanistic explanation or hypothesis, an embodiment of the invention can nonetheless be operative and useful.

DETAILED DESCRIPTION

Figures 1A, 1B:
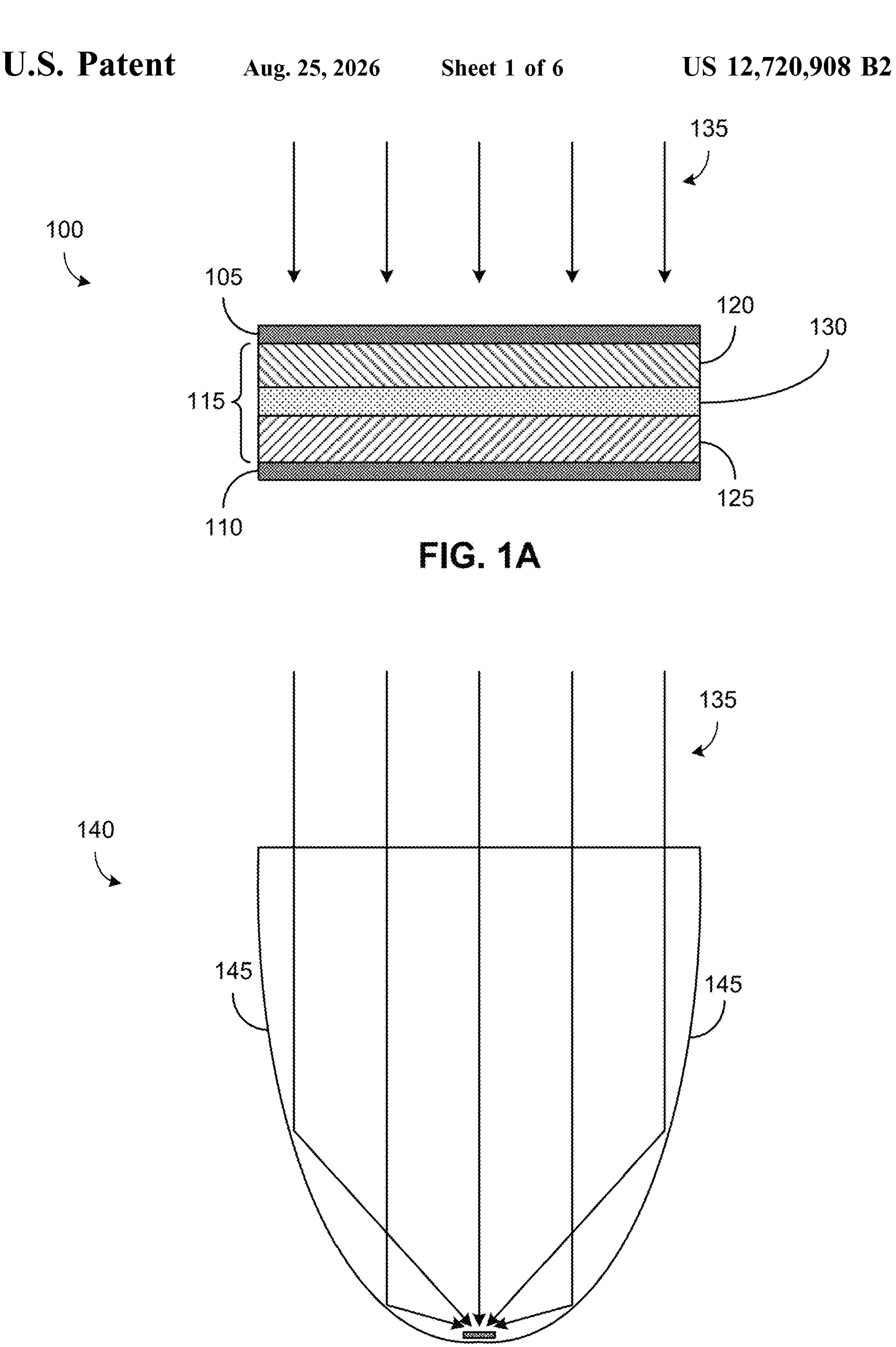
FIG. 1A provides a schematic cross-sectional illustration of a photovoltaic cell according to various embodiments.
FIG. 1B provides a schematic cross-sectional illustration of an optical concentrator according to various embodiments.

Described herein are photovoltaic modules that include features such as solar tracking, solar concentration, tandem cell arrangements, and thermal management to achieve high photovoltaic efficiency. The photovoltaic modules can be constructed using a variety of different materials and configurations or as a monoblock functionally graded structure to limit manufacturing, operational, and maintenance complexities while achieving high performance.

Exemplary materials include silicon, cadmium-telluride, gallium-arsenide, cadmium-indium-gallium-selenide, perovskites, organic P-Dot, poly-styrene-sulfonates (PSS), electrically conductive polymers (e.g. polyaniline), block-co-polymers, functionally graded polymers or semiconductors, modified using any combination of conductive dopants, additives, functionalized polymers or mechanical actuators, micro machines, microfluidics that are capable of producing as a result of their function improved and precise solar tracking.

As an example, the photovoltaic modules can include any suitable photovoltaic cell configuration, including those constructed from low-cost and readily available materials, such as cadmium telluride (CdTe), which can be tuned for high sunlight conversion efficiency and/or paired with other materials in a tandem configuration to achieve high sunlight conversion efficiency. Such materials and configurations are not intended to be limiting, and the photovoltaic modules can include other photovoltaic cells, including single junction or multiple junction/tandem configurations, such as, but not limited, to those comprising single crystal silicon, multicrystalline silicon, amorphous silicon, copper indium gallium selenide, gallium arsenide, cadmium telluride, a dye-sensitized material, a perovskite material, an organic photovoltaic material, or any combination of these.

The photovoltaic modules can include a plurality of photovoltaic cells, each of which can have any suitable lateral and/or thickness dimensions. In some cases, the photovoltaic cells can have lateral dimensions considerably smaller than the photovoltaic modules overall, such that photovoltaic cells occupy only a fractional surface area of the module and so that many photovoltaic cells can be placed within the lateral area of the photovoltaic module. In some examples, optical concentration can be used to focus and concentrate the incident radiation onto the photovoltaic cells, allowing a reduced amount of photovoltaic material to be used in the photovoltaic module, as compared to other photovoltaic modules where the photovoltaic material occupies a substantial entirety of the surface area of the modules, while still maintaining high conversion efficiency. Including an optical concentrator in the photovoltaic modules described herein can increase the intensity of incident solar radiation received at the photovoltaic cell by any suitable amount, such as by amounts of about 5× to about 200×.

Various optical concentrator configurations can be used. In some cases, a lens or lens array is positioned over a plurality of photovoltaic cells to focus incident radiation onto the photovoltaic cells. In other examples, a reflective focusing element is used. For example, the optical concentrator may comprise a parabolic cup style configuration, where reflective sidewalls direct and concentrate incident radiation onto a photovoltaic cell positioned at or near the focus of the parabolic geometry. In some examples, a parabolic cup comprises a polygonal structure (e.g., a hexagon) with sidewalls that are parabolic shaped. The use of parabolic shapes, however, is not intended to be limiting and other focusing shapes, such as concave shapes, are contemplated. In some examples, non-imaging optical devices are used as optical concentrators to direct and focus any incident radiation into a smaller area without regards to maintaining an optical image quality. For example, a Winston cone can be used to accept incident radiation through a large entrance aperture and concentrate the radiation through a smaller exit aperture.

Non-imaging optics can be useful for configurations where the photovoltaic cell is not at a focal point of the optical system, but is in a position where it can receive the concentrated radiation.

Non-imaging optics can be further be useful for configurations where the concentrated radiation is more uniformly spread across the photovoltaic cell. In some cases, an optical diffuser can also or alternatively be used for more uniformly spreading concentrated radiation across the photovoltaic cell.

Focusing incident radiation onto a photovoltaic cell can, in some examples, result in high temperatures in the photovoltaic cell due to large amounts of heat being focused onto the cell. In some cases, high temperatures can degrade photovoltaic performance and or longevity of the materials, so limiting the temperature and/or buildup of heat in the photovoltaic cells may be desirable. In some examples, a thermal management system is coupled to the photovoltaic cells to remove heat from the photovoltaic cells, allowing for reductions in temperature. In some examples, the thermal management system may comprise heat conducting material coupled to the photovoltaic cell. Due to the significant amount of heat that can be placed on a photovoltaic cell under optical concentrating configurations, it may be desirable for the heat conducting material to exhibit a thermal conductivity greater than or about 1 W/m·K, greater than or about 10 W/m·K, greater than or about 50 W/m·K, greater than or about 100 W/m·K, greater than or about 1000 W/m·K, greater than or about 2000 W/m·K, greater than or about 3000 W/m·K, greater than or about 4000 W/m·K, or up to about 5000 W/m·K. In some cases, high thermally conductive metals, such as copper, may be used. In other cases, micro- or nano-structured carbonaceous material, such as graphene, graphene oxide, carbon nanotubes, diamond, diamond-like carbon, exfoliated graphite, carbon black, or the like may be used as or included in the heat conducting material. Graphene-, diamond-, or other carbon nanotube-based materials may be desirable, as these materials can exhibit extremely high thermal conductivities, such as in excess of about 100 W/m·K or 1000 W/m·K, and may serve as both heat conducting material and also as electrodes or transparent electrodes of the photovoltaic cell due to their electrical conductivity. Including micro- or nano-structured carbonaceous material in electrodes or transparent electrodes of the photovoltaic cells can allow for efficient coupling of the heat conducting material to the photovoltaic cells to draw heat away from the photovoltaic cells.

For optimal collection of incident solar radiation, it may be desirable to orient the photovoltaic cells such that their surface is at a particular orientation with respect to the sun, such as perpendicular to the sun. Conventional solar tracking systems are generally large, bulky, and consume large amounts of energy. The photovoltaic modules described herein include a flexible substrate directly comprising a solar tracking structure that is energy efficient and configured to orient or tilt the photovoltaic cells and/or the optical concentrators to a specific tilt angle to allow solar tracking. In some examples, the flexible substrate includes origami- or kirigami-type structures, which can tilt the flexible substrate and any structures supported thereon (e.g., a photovoltaic cell and/or an optical concentrator). For some flexible substrate with origami or kirigami structures, applying lateral forces and/or translations can be used to adjust the tilt angle.

FIG. 1A provides a schematic cross-sectional illustration of an example photovoltaic cell 100. Photovoltaic cell 100 includes a first electrode 105, a second electrode 110, and a photovoltaic junction region 115 between the first electrode 105 and the second electrode 110.

Without limitation, other components may be included in photovoltaic cell, such as one or more optical layers, anti-reflection coatings, substrates, backside reflectors, buffer layers, such as hole transport layers, electron transport layers, hole blocking layers, electron blocking layers, etc., or the like. Photovoltaic junction region 115 may comprise one or more semiconductor materials arranged to form one or more photovoltaic junctions, such as a p-n junction and/or a heterojunction. As illustrated, photovoltaic junction region 115 comprises a first photovoltaic junction 120 and a second photovoltaic junction 125, with an interconnecting layer 130 between the first photovoltaic junction 120 and the second photovoltaic junction 125. The interconnecting layer 130 may be a tunnel junction or recombination layer, for example.

Example materials for interconnecting layer 130 include, but are not limited to semiconductor materials, thin metal films, transparent conductors, conductive polymers, or the like. FIG. 1A also shows solar radiation 135 incident on photovoltaic cell 100. First electrode 105 may comprise a transparent conductive material, such as a transparent conducting oxide (e.g., indium doped tin oxide, ITO), a thin metal film, a graphene film, or the like.

It will be appreciated that the configuration of photovoltaic cell 100 depicted in FIG. 1A is merely an example for purposes of illustration, is not to scale, and is not intended to be limiting.

FIG. 1B provides a cross-sectional schematic illustration of an optical concentrator 140 in which photovoltaic cell 100 is placed. Optical concentrator 140 is shown with approximately parabolic shaped walls 145, such that incident solar radiation 135 is focused onto photovoltaic cell 100. It will be appreciated that walls 145 of optical concentrator 140 may not have an exactly parabolic shape, but may include a suitable concave curvature in order to redirect indicated solar radiation 135 onto photovoltaic cell 100. In this way, the intensity of solar radiation 135 that reaches photovoltaic cell 100 can be increased, which can result in efficiency gains and reduction of photovoltaic material used for a photovoltaic module including optical concentrator 140 and photovoltaic cell 100 since the incident solar radiation 135 collected over a relatively large area by optical concentrator 140 can be directed to the relatively small area of photovoltaic cell 100. It will be appreciated that optical concentrator 140 is shown as a focusing/imaging optic, but other optical concentrators, optionally including non-imaging optical configurations, can be used.

FIG. 1A and FIG. 1B show incident solar radiation 135 approximately orthogonal to the top surface of photovoltaic cell 100, a configuration that will generally provide maximum collection efficiency. Over the course of the day, the position of the sun will change in the sky and such that the incidence angle of incident solar radiation 135 will change. A solar tracking system can be used to orient photovoltaic cell 100 and optical concentrator 140 such that the incident solar radiation 135 remains approximately orthogonal to the top surface of photovoltaic cell 100 for as wide a duration as possible.

Figure 2A:
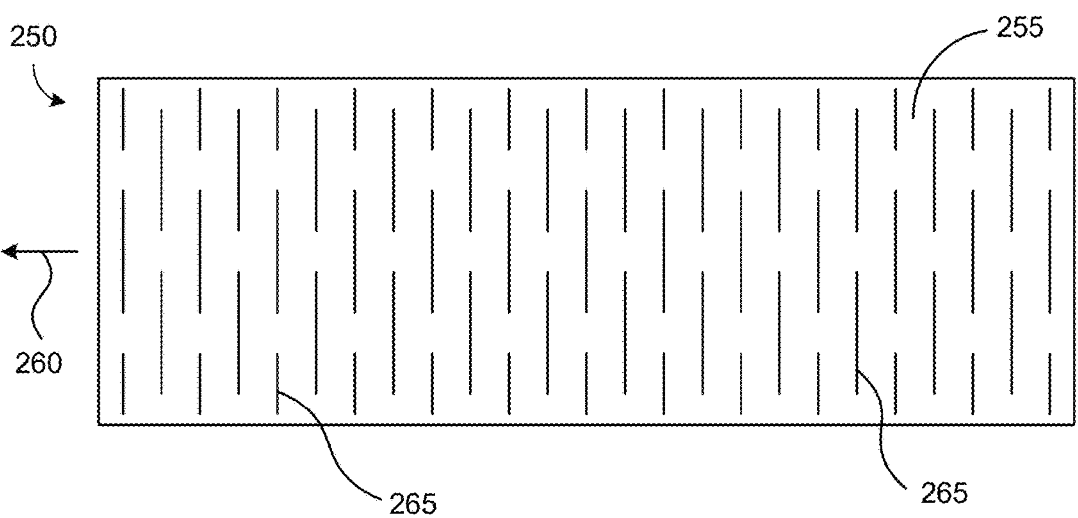
FIG. 2A provides a schematic top-view illustration of a flexible substrate comprising a solar tracking structure according to various embodiments.

FIG. 2A shows a schematic top view of an example flexible substrate 250 for use in a photovoltaic module for solar tracking. The structure of flexible substrate 250 is configured to allow portions 270 of the top surface 255 of flexible substrate to orient at a tilt angle based on application of a lateral force or displacement 260. As illustrated, flexible substrate 255 includes a plurality of cuts 265 through the flexible substrate, which define a kirigami-based or origami-based solar tracking structure. Although FIG. 2A shows one example of a kirigami-based or origami-based solar tracking structure for flexible substrate 255, the depicted configuration is not intended to be limiting and other examples of kirigami-based or origami-based solar tracking structures can be used.

Figure 2B:
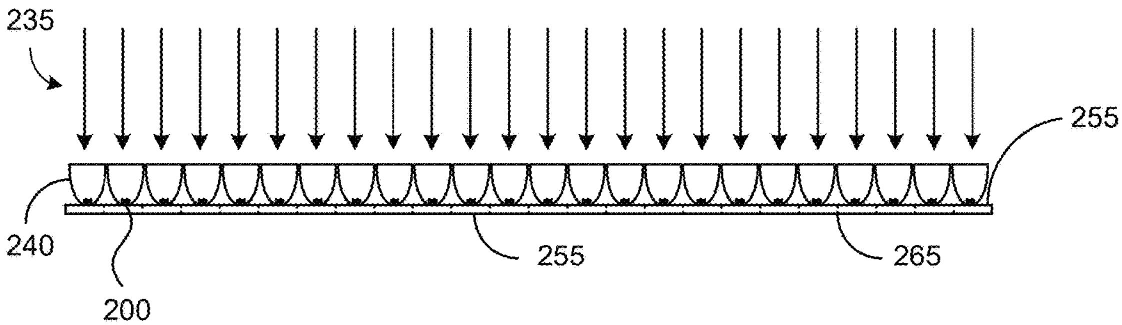
FIG. 2B provides a schematic cross-sectional illustration of components of a photovoltaic module according to various embodiments.
Figure 2C:
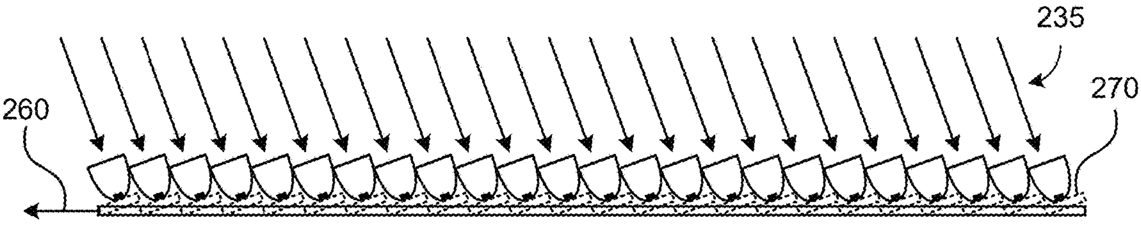
FIG. 2C provides a schematic cross-sectional illustration of components of a photovoltaic module showing solar tracking according to various embodiments.

FIG. 2B and FIG. 2C shows flexible substrate 255 in cross-section, with a plurality of optical concentrators 240 disposed thereon and each including a photovoltaic cell 200 therein. In the configuration illustrated in FIG. 2B, incident solar radiation 235 is approximately orthogonal to the plane of flexible substrate 255, and the optical concentrators 240 and photovoltaic cells 200 are aligned to receive the incident solar radiation 235. In the configuration illustrated in FIG. 2C incident solar radiation 235 is oriented approximately 20° from the plane of flexible substrate 255. The optical concentrators 240, photovoltaic cells 200, and portions 270 of flexible substrate 255 are oriented at a corresponding tilt angle of approximately 20° in order to receive the incident solar radiation 235 at a desirable configuration for focusing and photovoltaic conversion. Such configuration can be achieved, in embodiments, by applying a lateral displacement 260 to flexible substrate 255.

It will be appreciated that FIGS. 2A-2C are not to scale, but are intended to show relevant features. In some examples, the optical concentrators 240 may occupy a height from the flexible substrate 255 up to 50 mm. Such a height can allow for large optical concentration factors, such as from about 5× to about 200×, while still permitting an overall thickness of the photovoltaic module to be limited to practical amounts such that the photovoltaic module are not unnecessarily oversized.

Figure 3A:
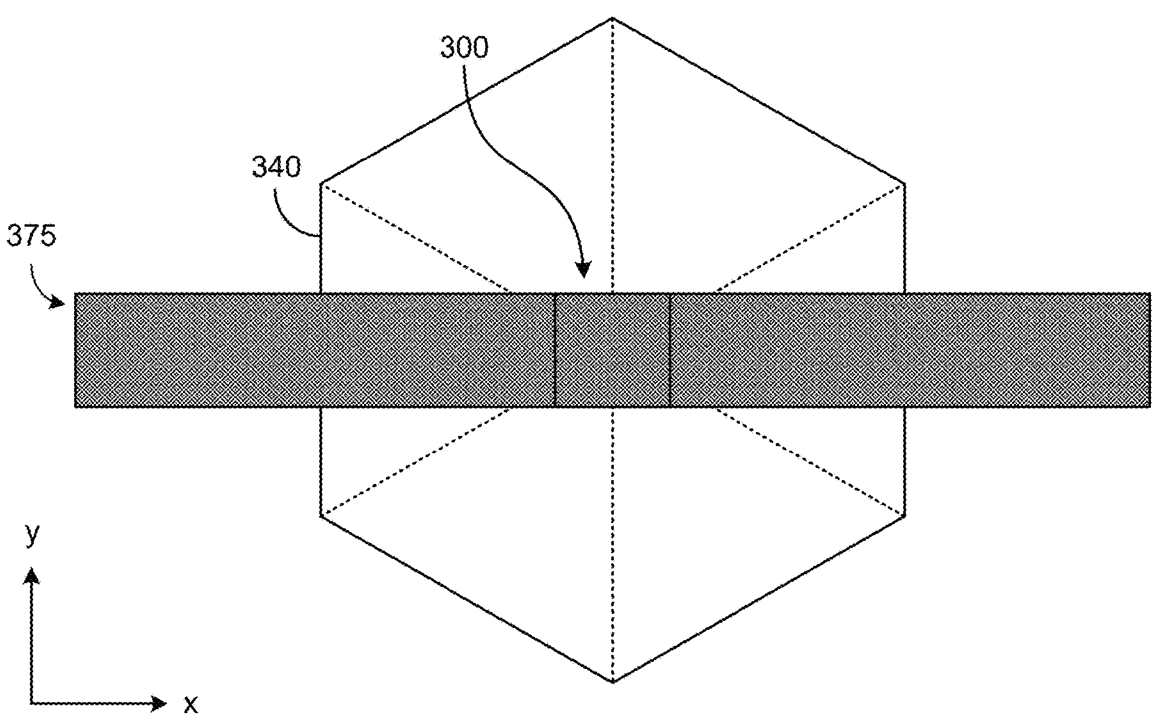
FIG. 3A provides a cutaway top schematic illustration of an optical concentrator, photovoltaic device, and thermal management structure according to various embodiments.
Figure 3B:
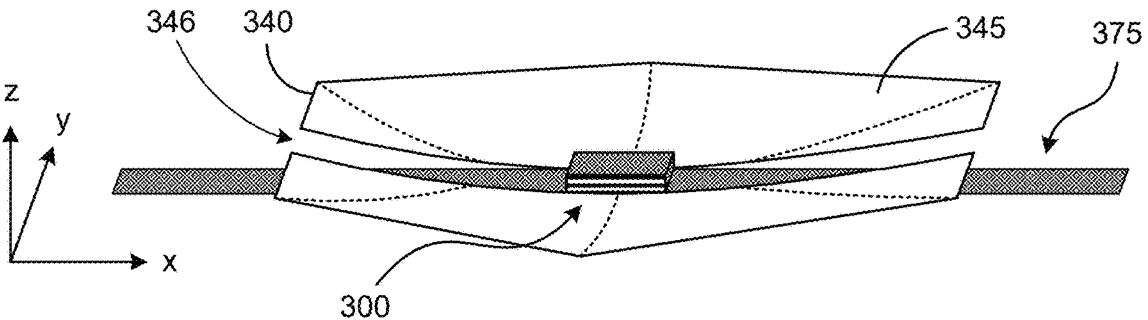
FIG. 3B provides a cutaway perspective schematic illustration of an optical concentrator, photovoltaic device, and thermal management structure according to various embodiments.
Figure 3C:
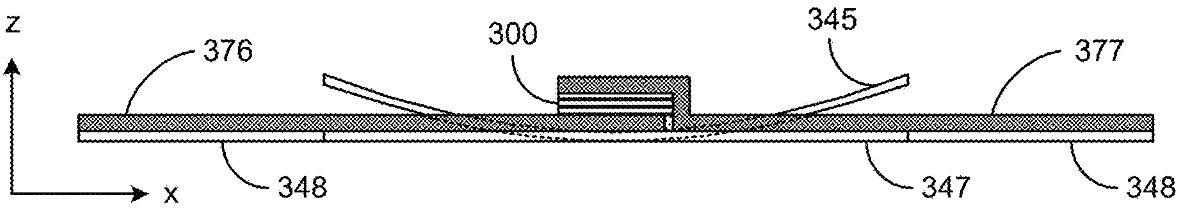
FIG. 3C provides a cutaway cross-sectional schematic illustration of an optical concentrator, photovoltaic device, and thermal management structure according to various embodiments.

As noted above, since the optical concentrators focus incident solar radiation onto the photovoltaic cells, the photovoltaic cells can rapidly heat to high temperatures, but this can be at least partly avoided by using a suitable thermal management system. FIG. 3A, FIG. 3B, and FIG. 3C depict example schematic illustrations, in a partial cutaway view, of an optical concentrator 340, with a photovoltaic cell 300 including thermal management system components 375. As illustrated, optical concentrator 340 has a hexagonal shape with parabolic sidewalls 345, but other shapes for optical concentrator 340 can be used. In FIGS. 3A-3C, only a portion of the full height of the optical concentrator 340 is shown to not obscure other details, and it will be appreciated that the optical concentrator 340 may extend significantly further in the x-, y-, and z-directions than depicted in FIGS. 3A-3C.

Thermal management system components 375, can be positioned in contact with a top, bottom, and/or sides of the photovoltaic cell 300, depending on the particular configuration and material used. In the example illustrated in FIGS. 3A-3C, thermal management system components 375 are positioned in contact with a top and bottom of photovoltaic cell 300 as well as one side of photovoltaic cell 300. Such a configuration is not limiting, but illustrates a configuration where, for example, thermal management system components 375 may comprise or provide both thermal and electrical conductivity with photovoltaic cell 300. For example, thermal management system components 375 may comprise an electrically and thermally conductive graphene structure, which may correspond to, be coextensive with, or be in electrical contact with electrodes of photovoltaic cell 300. Advantageously, graphene structures may be optically transparent, allowing incident solar radiation to pass to photovoltaic cell 300.

A first portion 376 of thermal management system components 375 may be in thermal and/or electrical contact with a bottom surface of photovoltaic cell 300 and a second portion 377 of thermal management system components 375 may be in thermal and/or electrical contact with a top surface of photovoltaic cell 300. Such a configuration can provide for electrical isolation between first portion 376 and second portion 377 to direct photocurrent and/or photovoltage elsewhere.

Sidewalls 345 of optical concentrator 340 can include cut-outs 346 to permit passage of thermal management system components 375 elsewhere in the photovoltaic module, such as to an electrical bus and/or heat sink. Portions 347 of sidewalls 346 of optical concentrator 340 remaining after establishing cut-outs 346 can optionally be retained as a support for thermal management system components 375 as they are directed outside of optical concentrator 340.

Figure 4:
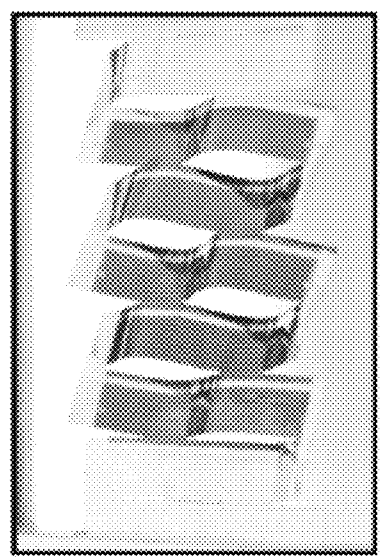
FIG. 4 provides images of photovoltaic cells incorporating a kirigami-based solar tracking structure.
Figure 4:
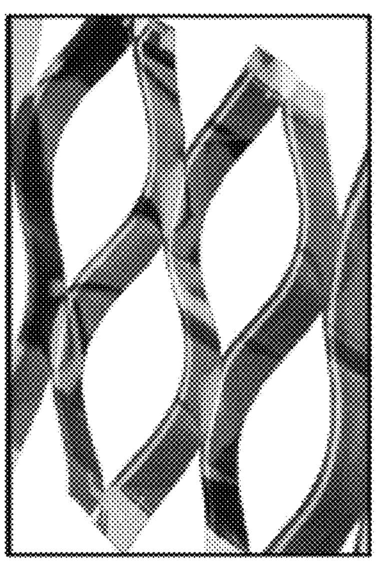
Figure 4:
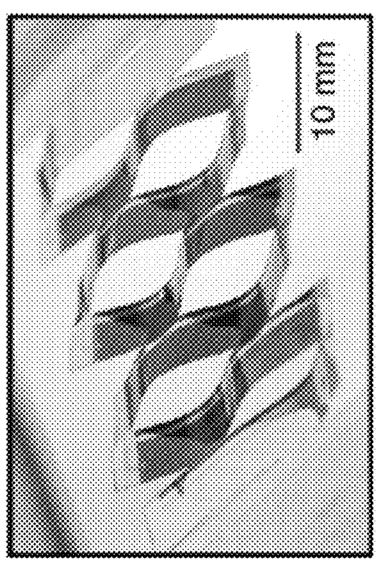
Figure 5:
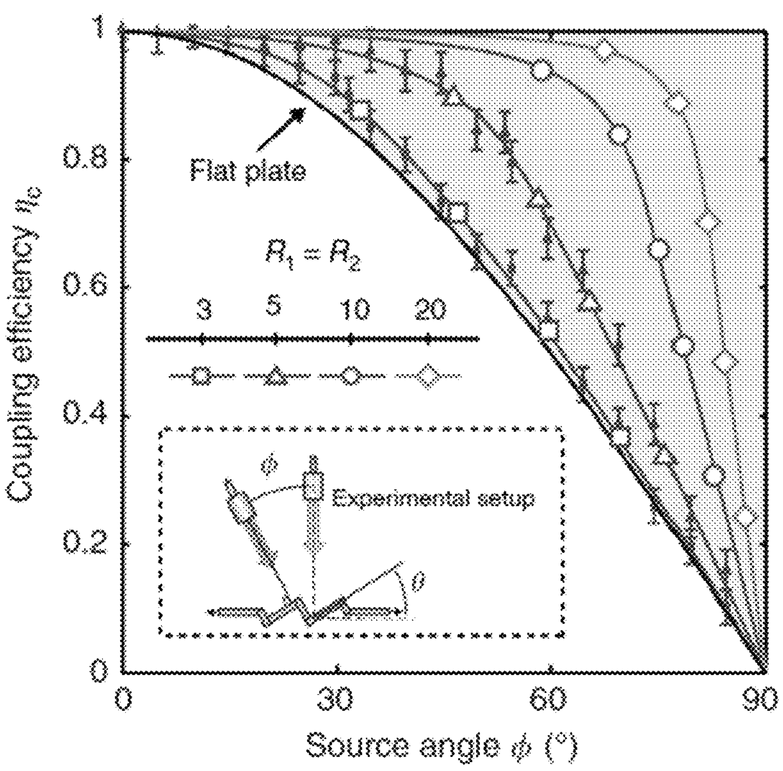
FIG. 5 and FIG. 6 provide data showing performance of photovoltaic cells incorporating kirigami-based solar tracking structures.
Figure 6:
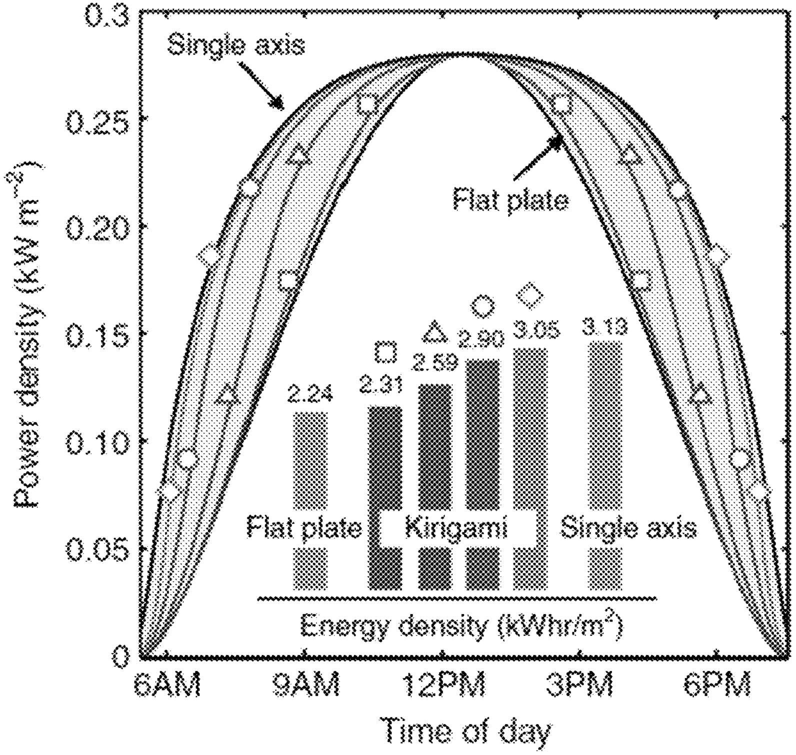

FIG. 4 provides images of thin-film GaAs solar cells mounted on a Kapton carrier substrate having a kirigami configuration. Here, the substrate includes a plurality of cuts arranged to deform the substrate into a tilted arrangement a stretched configuration, such that the thin-film GaAs solar cells have a tilt angle relative to the plane of the substrate when in the unstretched configuration. FIG. 5 provides a plot showing normalized and simulated solar cell short circuit current density on two samples. The data in the plot show that performance can be increased by increasing the density of cuts. FIG. 6 provides a plot showing output electrical power density incident on the solar cell as a function of time of day for different kirigami structures, in comparison with a stationary panel and a single axis solar tracking system, showing the higher-density kirigami structures are able to approximate performance of the single axis solar tracking system. Further details of such configuration are provided in Lamoureux et al., 2015, "Dynamic kirigami structures for integrated solar tracking," Nature Comm. 6:8092, DOI: 10.1038/ncomms9092, hereby incorporated by reference.

The invention may be further understood by the following non-limiting examples.

EXAMPLE 1

Figure 7:
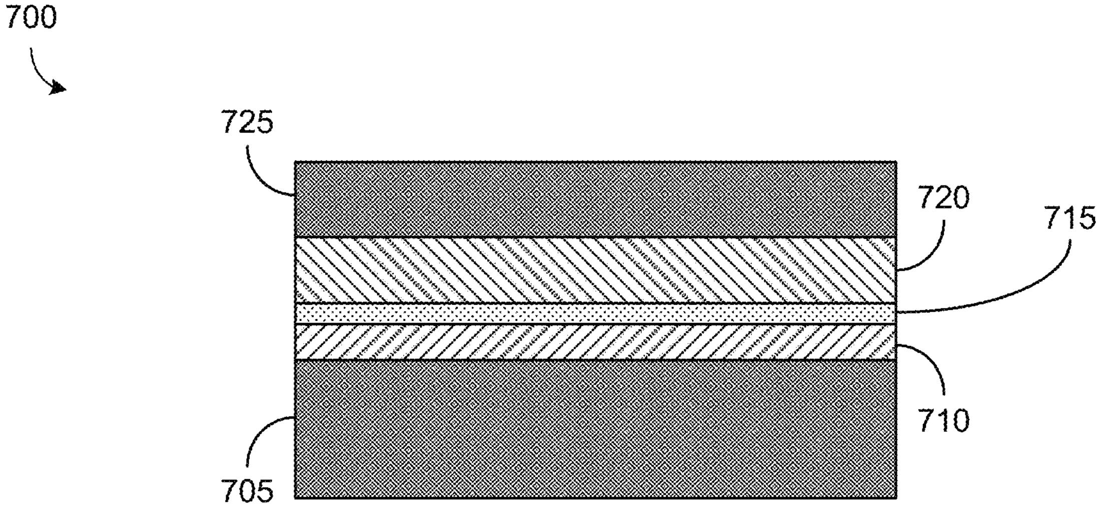
FIG. 7 provides a schematic cross-sectional illustration of a CdTe-based photovoltaic cell structure.

FIG. 7 shows a schematic for a CdTe cell 700 useful for producing a Kirigami solar device. In this Example, element 705 corresponds to a transparent substrate of 50 μm thickness comprised of polyimide. On this substrate, a 60 nm thickness transparent conductive layer (TLC) of $SnO_2$ is deposited using physical vapor deposition and is shown schematically as element 710. Following deposition of the TCL onto the transparent substrate, a junction partner layer, 715, comprising CdS with thickness 25 nm is deposited using physical vapor deposition. A CdTe absorber film, 720, of thickness 200 nm is next deposited on top of the junction partner layer 715 using physical vapor deposition. Following this, an ohmic contact layer, 725, is deposited on top of the CdTe absorber film 720 completing the solar cell. To attach the ohmic contact layer 725 to the p-type CdTe absorber film 720, the CdTe is first etched with phosphoric acid, followed by a base etch, followed by deposition of a 1-5 nm thick copper layer using physical vapor deposition. Carbon is used as an isolation layer in the ohmic contact in combination with 10% HgTe and 10% $Cu_2Te$.

A 300 mm diameter cell fabricated according to the above description is diced into 25 mm×25 mm squares using a laser cutter. To reduce delamination, sharp corners are avoided and a corner radius of 2 mm is used on all corners. Individual cells are tested for shorts, inspected for mechanical damage, and binned for future device assembly.

FIG. 2A shows a design of the substrate that provides single-axis tracking that the solar panels described previously are attached to. In this Example, the material, 255, corresponds to a flat sheet of 50 μm thickness polyimide of 1300 mm length and 250 mm height with through-cuts, 256, produced in a regular pattern across the surface. Cuts of 75 mm in length are produced in the polyimide using a laser cutter, with an equal distance of 50 mm in between cuts in both the x- and y-directions. Positive and negative copper conductive traces are deposited on the surface and protected with a capping layer. Strain is applied in the direction indicated by 260, which causes the substrate to tilt.

Pads to attach the panels to and provide electrical connections are produced out of rigid printed circuit boards. 30 mm×30 mm with 2 mm corner radius boards are cut from PCB stock using a laser cutter. For a configuration as in FIGS. 3A-3C, these pads correspond to elements 347. One area on the pad is used to provide electrical contact with the solar back panel and the other pad is to provide electrical contact with the top panel. Between the back panel and PCB pad, a thermal paste comprising ~40% by mass exfoliated graphite (3D graphene), ~50% two-part epoxy and 10% fillers and other additives is used. Individual cells are attached to the PCB pad with the back electrode being put in thermal and electrical contact using the above conductive epoxy. Following attachment of the cell to the back panel, 35 kPa of force is uniformly applied normal to the cell/panel surface and the conductive epoxy is cured at 50° C. for 1 hour.

36 cell/panel assemblies are then attached to the substrate shown, such as according to a configuration depicted in FIG. 2B so the geometric center of each cell/panel assembly lies on the lower geometric center of the 75 mm cut using 2-part epoxy. The top contact pad on the panel is bonded to the top contact grid of the panels. Following this, the top and bottom contact pads are all soldered to the appropriate locations on the flexible PCB substrate. Following a continuity check on each cell, on each cell/panel corner, epoxy is used to attached the components together and prevent delamination during operation.

Using data from solar traverse over the millennia and precise geolocation and time/date, the sun can be tracked. Depending on the value of strain produced on the superstructure in the direction of 260 in FIG. 2A, different amounts of tilt can be achieved. By rotating the device perpendicular to the direction of the cuts and 260 in FIG. 2A, true 2-axis sun tracking can be achieved. Additionally, by using positive feedback of the power the panels are producing, fine tuning of the tilt angle can maximize solar utilization.

REFERENCES

U.S. Patent Application Publication Nos. US 2016/0136877, US 2016/0285410, US 2022/0003577, US 2022/0045644.

Evke et al., 2020, "Kirigami-Based Compliant Mechanism for Multiaxis Optical Tracking and Energy-Harvesting Applications," Adv. Eng. Mater. 2001079, DOI: 10.1002/adem.202001079.

Lamoreux et al., 2015, "Dynamic kirigami structures for integrated solar tracking," Nature Communications, 6, 8092, DOI: 10.0138/ncomms9092.

Lee et al., 2016, "Origami Solar-Tracking Concentrator Array for Planar Photovoltaics,"ACS Photonics, 3, 2134-2140, DOI: 10.1021/acsphotonics.6b00592.

Sang et al., 2019, "Electronic and Thermal Properties of Graphene and Recent Advances in Graphene Based Electronics Applications," Nanomaterials, 9, 374, DOI: 10.3390/nano9030374.

Tan et al., 2017, "Graphene as a flexible electrode: review of fabrication approaches," J. Mater. Chem. A 5, 17777, DOI: 10.1039/c7ta05759h.

Tagliazucchi et al., 2014 "Dissipative self-assembly of particles interacting through time-oscillatory potentials," Proc. Natl. Acad. Sci. U.S. A. 111, 9751-9756, DOI: 10.1073/pnas.2117971119.

STATEMENTS REGARDING INCORPORATION BY REFERENCE AND VARIATIONS

All references throughout this application, for example patent documents, including issued or granted patents or equivalents and patent application publications, and non-patent literature documents or other source material are hereby incorporated by reference herein in their entireties, as though individually incorporated by reference.

All patents and publications mentioned in the specification are indicative of the levels of skill of those skilled in the art to which the invention pertains. References cited herein are incorporated by reference herein in their entirety to indicate the state of the art, in some cases as of their filing date, and it is intended that this information can be employed herein, if needed, to exclude (for example, to disclaim) specific embodiments that are in the prior art.

When a group of substituents is disclosed herein, it is understood that all individual members of those groups and all subgroups and classes that can be formed using the substituents are disclosed separately. When a Markush group or other grouping is used herein, all individual members of the group and all combinations and subcombinations possible of the group are intended to be individually included in the disclosure. As used herein, "and/or" means that one, all, or any combination of items in a list separated by "and/or" are included in the list; for example "1, 2 and/or 3" is equivalent to "1, 2, 3, 1 and 2, 1 and 3, 2 and 3, or 1, 2, and 3".

Every formulation or combination of components described or exemplified can be used to practice the invention, unless otherwise stated. Specific names of materials are intended to be exemplary, as it is known that one of ordinary skill in the art can name the same material differently. It will be appreciated that methods, device elements, starting materials, and synthetic methods other than those specifically exemplified can be employed in the practice of the invention without resort to undue experimentation. All art-known functional equivalents, of any such methods, device elements, starting materials, and synthetic methods are intended to be included in this invention. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition, in a description of a method, or in a description of elements of a device, is understood to encompass those compositions, methods, or devices consisting essentially of and consisting of the recited components or elements, optionally in addition to other components or elements. The invention illustratively described herein suitably may be practiced in the absence of any element, elements, limitation, or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. A device, comprising:

a substrate comprising a plurality of cuts that define a support structure; and an optical concentrator and an optical cell, wherein the optical concentrator comprises an origami or kirigami structure and the support structure is configured to tilt at least one of the optical concentrator or the optical cell at a tilt angle based on at least one of: application of a force or a displacement to the substrate, a location of a first cut included in the plurality of cuts, or a size of a second cut included in the plurality of cuts.

2. The device of claim 1, further comprising:

a thermal management structure, in thermal contact with the optical cell positioned within the optical concentrator, to conduct heat from the optical cell.

3. The device of claim 2, wherein the thermal management structure is positioned on a first radiation-receiving surface of one or more of the substrate, the optical concentrator, or the optical cell or opposite a second radiation-receiving surface of one or more of the substrate, the optical concentrator, or the optical cell.

4. The device of claim 2, wherein the thermal management structure comprises one or more through vias for passing thermal energy from a third radiation-receiving surface of one or more of the substrate, the optical concentrator, or the optical cell to a surface opposite the third radiation-receiving surface.

5. The device of claim 2, wherein the thermal management structure comprises a micro- or nano-structured carbonaceous material and dissipates heat from the optical cell through a heat-conducting thermal circuit.

6. The device of claim 2, wherein the thermal management structure comprises graphene, graphene oxide, carbon nanotubes, diamond, diamond-like carbon, exfoliated graphite, or carbon black.

7. The device of claim 2, wherein the thermal management structure comprises a material having a thermal conductivity greater than about 100 W/m·K.

8. The device of claim 2, wherein the thermal management structure comprises or is coupled to at least one of: one or more electrodes of the optical cell or a waste-heat-to-power converter.

9. The device of claim 1, wherein the optical cell is a photovoltaic cell or a reflector cell.

10. The device of claim 1, wherein the substrate comprises a polymer, metal foils, composites, flexible material, spring steel, or combinations thereof.

11. The device of claim 1, wherein the substrate comprises graphene or includes a graphene coating on at least a portion of the substrate.

12. The device of claim 1, wherein the optical concentrator is arranged on the substrate to receive, focus, track, and/or direct incident solar radiation onto the optical cell and comprises a parabolic cup, a polygonal structure having parabolic sidewalls, or a lens structure.

13. The device of claim 1, comprising a plurality of optical concentrators distributed across and supported by the substrate.

14. The device of claim 1, wherein the origami or kirigami structure comprises a three-dimensional structure produced from linear translation of a two-dimensional or planar structure.

15. The device of claim 1, wherein the optical concentrator comprises at least one of: a flexible base layer with a reflective coating thereon or a non-imaging optical device arranged to focus incident radiation onto the optical cell.

16. The device of claim 1, wherein the optical concentrator is characterized by at least one of: an optical concentration factor of from about 2× to about 500× or a height from the substrate of up to 50 mm.

17. The device of claim 1, wherein the optical cell comprises:

a first electrode positioned over the substrate;

a second electrode positioned over the substrate; and one or more photovoltaic junctions positioned between the first electrode and the second electrode.

18. The device of claim 1, wherein the optical cell includes one or more electrodes comprising a graphene layer or a micro- or nano-structured carbonaceous material layer.

19. The device of claim 1, wherein the optical cell comprises a perovskite/Si tandem photovoltaic cell, a CdTe/Si tandem photovoltaic cell, a perovskite/copper indium gallium selenide tandem photovoltaic cell, or an organic tandem photovoltaic cell.

20. The device of claim 1, wherein the plurality of cuts comprise a pattern of parallel non-concentric lines.

* * * * *